(12) United States Patent
Seko et al.

(10) Patent No.: US 12,740,142 B2
(45) Date of Patent: Sep. 15, 2026

(54) APPARATUS AND TEST ELEMENT GROUP

(71) Applicant: Micron Technology, Inc., Boise, ID (US)

(72) Inventors: Akiyoshi Seko, Higashihiroshima (JP); Yu Kosuge, Higashihiroshima (JP); Takahiro Sonoda, Higashihiroshima (JP); Kazuo Aizawa, Higashihiroshima (JP); Koji Hamada, Tama (JP)

(73) Assignee: Micron Technology, Inc., Boise, ID (US)

( * ) Notice: Subject to any disclaimer, the term of this patent is extended or adjusted under 35 U.S.C. 154(b) by 380 days.

(21) Appl. No.: 18/521,175

(22) Filed: Nov. 28, 2023

(65) Prior Publication Data

US 2024/0213251 A1 Jun. 27, 2024

Related U.S. Application Data

(60) Provisional application No. 63/477,274, filed on Dec. 27, 2022.

(51) Int. Cl.
*H10D 84/85* (2025.01)
*H10P 74/00* (2026.01)

(52) U.S. Cl.
CPC ......... *H10D 84/859* (2025.01); *H10P 74/277* (2026.01)

(58) Field of Classification Search
CPC .................... H10D 84/859; H10P 74/273–277
See application file for complete search history.

(56) References Cited

FOREIGN PATENT DOCUMENTS

| | | | | |
|---|---|---|---|---|
| JP | H05198816 A | * | 8/1993 | ......... H01L 29/7805 |
| JP | 2006202814 A | * | 8/2006 | ............. H01L 24/06 |

* cited by examiner

*Primary Examiner* — Evan G Clinton
(74) *Attorney, Agent, or Firm* — Dorsey & Whitney LLP

(57) ABSTRACT

According to one or more embodiments of the disclosure, an apparatus comprising a pad above a semiconductor substrate, an n-well in the semiconductor substrate, and a floating p-well in the semiconductor substrate is provided. The floating p-well is below the pad and surrounded by the n-well in the semiconductor substrate.

20 Claims, 8 Drawing Sheets

400
401
402
403
404
405
410
411
412
413
414
415
420
421
430
440
441
450
460
461
462
402&405
$C_{pw}$
A
X
Y
Z

APPARATUS AND TEST ELEMENT GROUP

CROSS REFERENCE TO RELATED APPLICATION(S)

This application claims priority to U.S. Provisional Application No. 63/477,274, filed Dec. 27, 2022. The aforementioned application is incorporated herein by reference, in its entirety, for any purpose.

BACKGROUND

A plurality of semiconductor chips are provided on a semiconductor wafer. The semiconductor chips include circuit regions and scribe regions. The circuit regions are provided in a matrix arrangement on the semiconductor wafer. In each circuit region, circuits including various circuit elements and components, such as transistors and conductive interconnects, are provided. The scribe regions are provided around the circuit regions. In certain portions of the scribe regions, test element groups (TEGs) may be provided. The TEGs include test circuits that are electrically probed to measure electric properties during testing. The test circuits in the scribe regions are formed by the same process used to form the circuits in the circuit regions on the same semiconductor wafer. The measured electric properties are used to determine whether the circuits formed in the circuit regions have the electric properties as expected or as designed.

DETAILED DESCRIPTION

Figure 1:
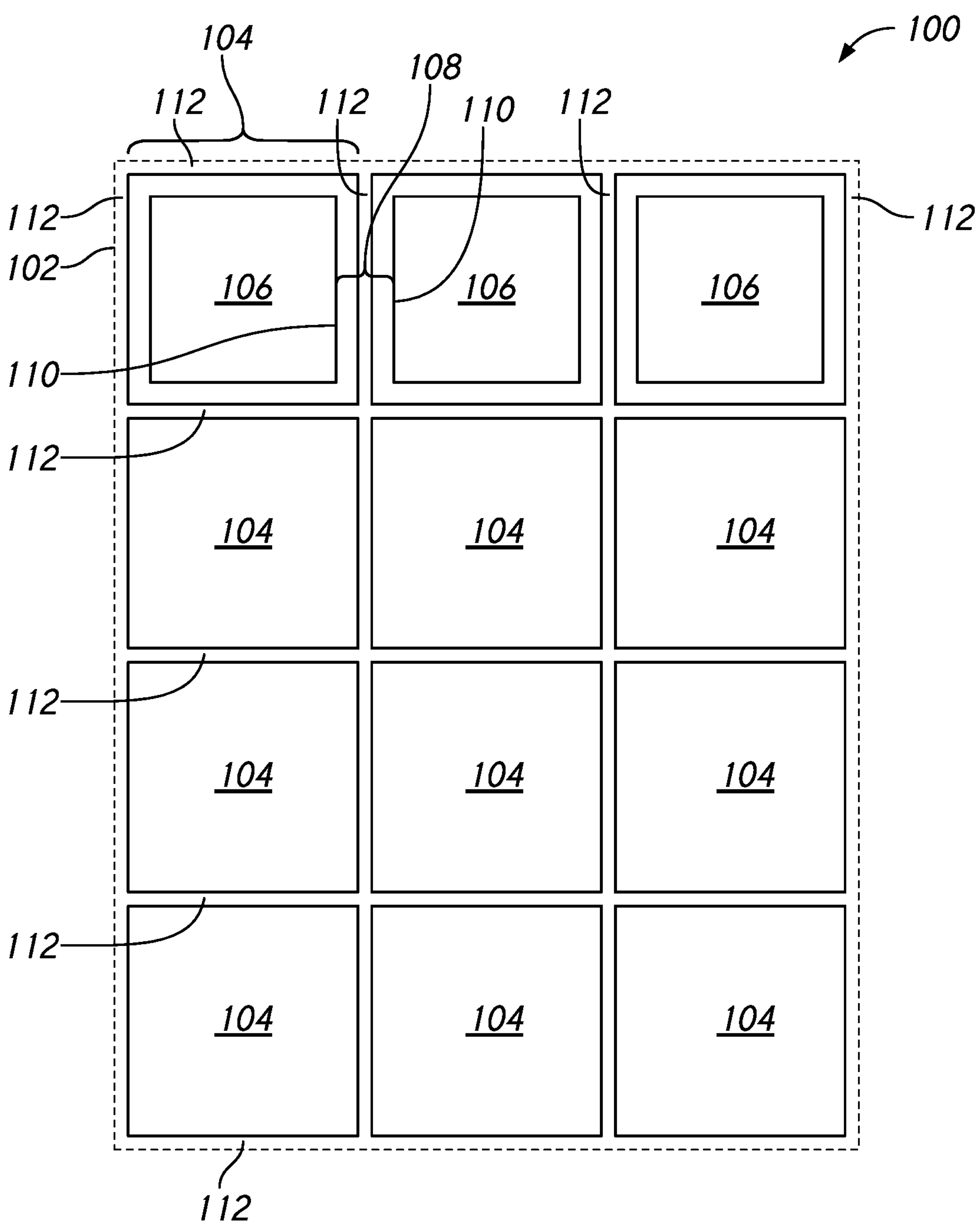
FIG. 1 depicts a layout of a plurality of semiconductor chips in a semiconductor wafer at least partly in a plan view according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, the dimensions and dimensional ratios of each unit do not necessarily match the actual dimensions and dimensional ratios in the embodiments.

FIG. 1 depicts an example of a layout of a plurality of semiconductor chips 104 in a semiconductor wafer 100 at least partly in a plan view in accordance with an embodiment of the disclosure. The semiconductor chips 104 may provide a plurality of semiconductor devices. The semiconductor chips 104 include circuit regions 106. Between the neighboring circuit regions 106 are scribe regions 108. The semiconductor chips 104 include circuit edges 110 around the corresponding circuit regions 106.

The circuit regions 106 are provided in a matrix arrangement. In each circuit region 106, circuits including various elements and components, such as transistors and conductive interconnects, are provided. In a case where the semiconductor chip 104 provides a memory device (that is one example of a semiconductor device), the circuit region 106 may include a plurality of memory banks that have a plurality of memory cells, one or more circuits that provide memory access functions, such as read operations and write operations to the memory banks/cells, and a control circuit that controls the circuits. One example of a memory device is a dynamic random access memory (DRAM). The examples and the embodiments of the disclosure are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, may also be applicable. Other examples of the semiconductor device, such as logic ICs (a microprocessor, an application-specific integrated circuit (ASIC) or the like), may also be applicable.

The scribe regions 108 are provided around the circuit regions 106. Each scribe region 108 includes the circuit edges 110, facing one another in a plan view, of the adjacent or neighboring semiconductor chips 104. Each scribe region 108 includes a scribe center region 112 between the circuit edges 110 of the adjacent semiconductor chips 104. A scribe line or a dicing line may be defined in the scribe center region 112 to be used for separating the semiconductor wafer 100 into the individual semiconductor chips 104 by dicing.

The scribe region 108 according to the present embodiment includes one or more test element groups (TEGs). For example, certain portions of the scribe region 108, such as those other than the scribe center region 112, remain intact from dicing include the one or more TEGs. Such TEGs may be referred to as scribe TEGs. Each TEG includes one or more test circuits that are electrically probed to measure electric properties or electric characteristics thereof during testing. The test circuits of the TEG in the scribe region 108 are formed by the same process used to form the circuits in the circuit region 106 on the same semiconductor wafer 100. The measured electric properties are used to determine whether the circuits formed in the circuit region 106 have the expected or designed electric properties. The test circuits of the TEG includes, for example, test transistors and various pads, such as a gate pad and a source-drain pad. A gate pad may be electrically connected or coupled to a gate of a test transistor. A source-drain pad may be electrically connected or coupled to a source and a drain of a test transistor. Pads may be provided in one single layer or in a plurality of layers stacked on each other above a semiconductor substrate. Insulating layers may be provided between the layers and the semiconductor substrate.

As one example of testing the circuits using the TEGs, such as high-speed circuits of a memory device, a gate vertical resistance (may also be referred to as a gate interfacial resistance) $R_{gv}$ of a transistor may be evaluated. The transistor may be a metal-oxide-semiconductor field-effect transistor (MOSFET). The MOSFET may be a complementary metal-oxide semiconductor (CMOS) transistor.

The gate vertical resistance $R_{gv}$ on a single device may be evaluated by high frequency impedance measurement. The gate vertical resistance $R_{gv}$ may be decomposed to resistance and capacitance components. The resistance and capacitance components of the gate vertical resistance $R_{gv}$ have frequency dependency. Measurement and analysis of these components may be helpful to reduce the gate vertical resistance $R_{gv}$ by process improvements including selecting of more appropriate gate materials, optimization of deposition conditions, adjustment of impurity concentration, and the like.

In high frequency impedance measurement for a single device, reduction or subtraction of parasitic resistance and capacitance (RC) components in the TEG is one important factor to achieve accurate extraction of the gate vertical resistance $R_{gv}$. The parasitic RC components include, for example, resistance on a routing line between a gate pad and a source-drain pad, and RC between the corresponding pad and well (pad-well RC or well-pad RC). The gate pad may be surrounded, in a plan view, by a well, which is connected to the source-drain pad, to prevent a noise, such as a noise from outside, from adversely affecting the pads and hence the TEG during testing.

To accurately evaluate the gate vertical resistance $R_{gv}$, there may be two or more TEGs provided. The multiple TEGs are used to measure the gate vertical resistance $R_{gv}$ at multiple stages of forming the semiconductor device on the semiconductor substrate, such as a stage after lower metal layers are provided and a stage after upper metal layers or a top metal layer are provided. Such multiple stage measurement and evaluation may contribute to reduction of time for forming or processing the semiconductor device.

In a case where a pad-well RC component is relatively large, such as a case where pads including the gate pad and the source-drain pad are provided in one or more lower metal layers relatively close to the semiconductor substrate, a layout or a configuration to reduce pad-well parasitic capacitance while maintaining protection or shielding from outside noise may be adopted, and the accuracy of the extracted resistance Rgv may be further improved.

Figures 2A, 2B:
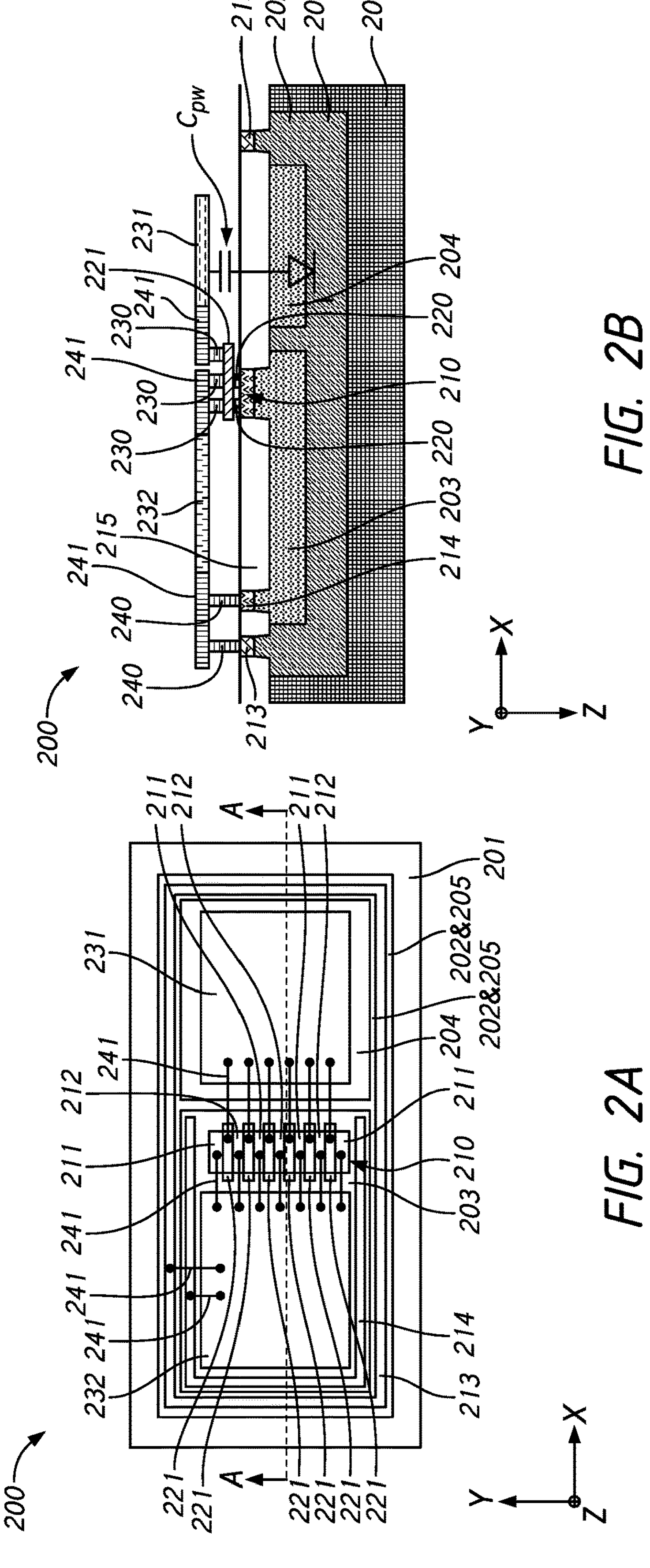
FIGS. 2A and 2B depict a schematic configuration of at least part of a TEG including an n-channel MOSFET in a scribe region on a semiconductor wafer in a plan view and a cross-sectional view, respectively, according to an embodiment of the disclosure.
Figure 2C:
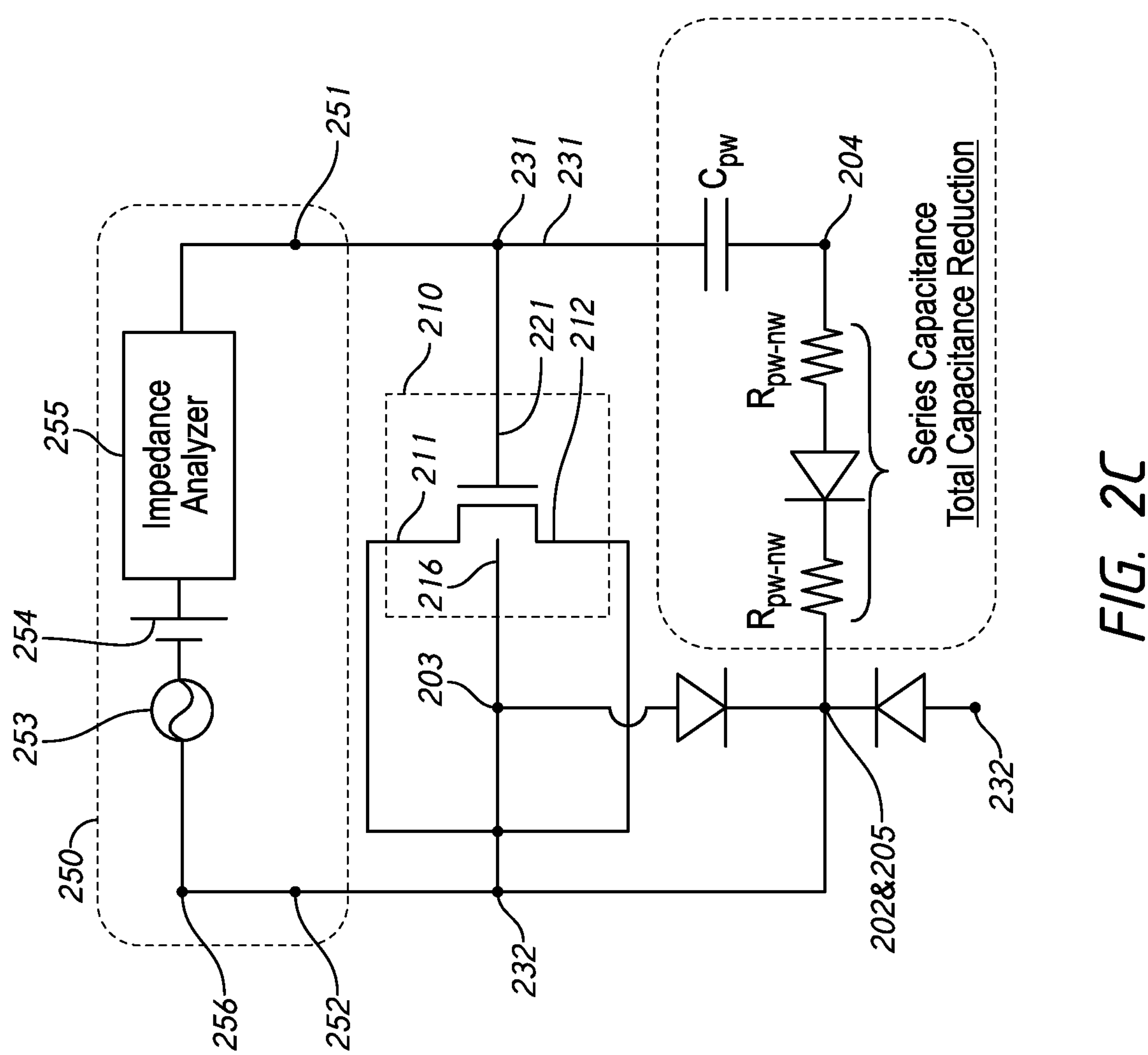
FIG. 2C depicts an equivalent circuit of a TEG and a test apparatus according to an embodiment of the disclosure.
Figures 3A, 3B:
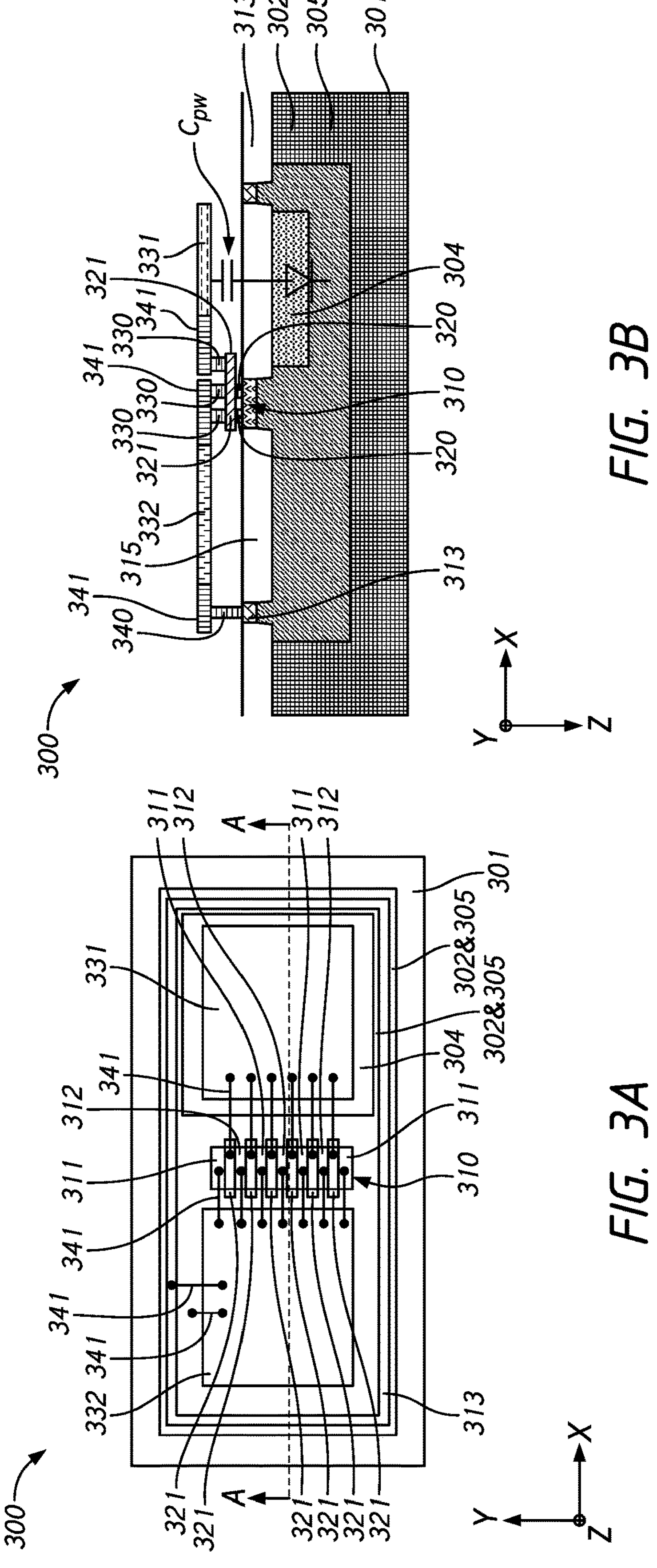
FIGS. 3A and 3B depict a schematic configuration of at least part of a TEG including a p-channel MOSFET in a scribe region on a semiconductor wafer in a plan view and a cross-sectional view, respectively, according to an embodiment of the disclosure.
Figure 3C:
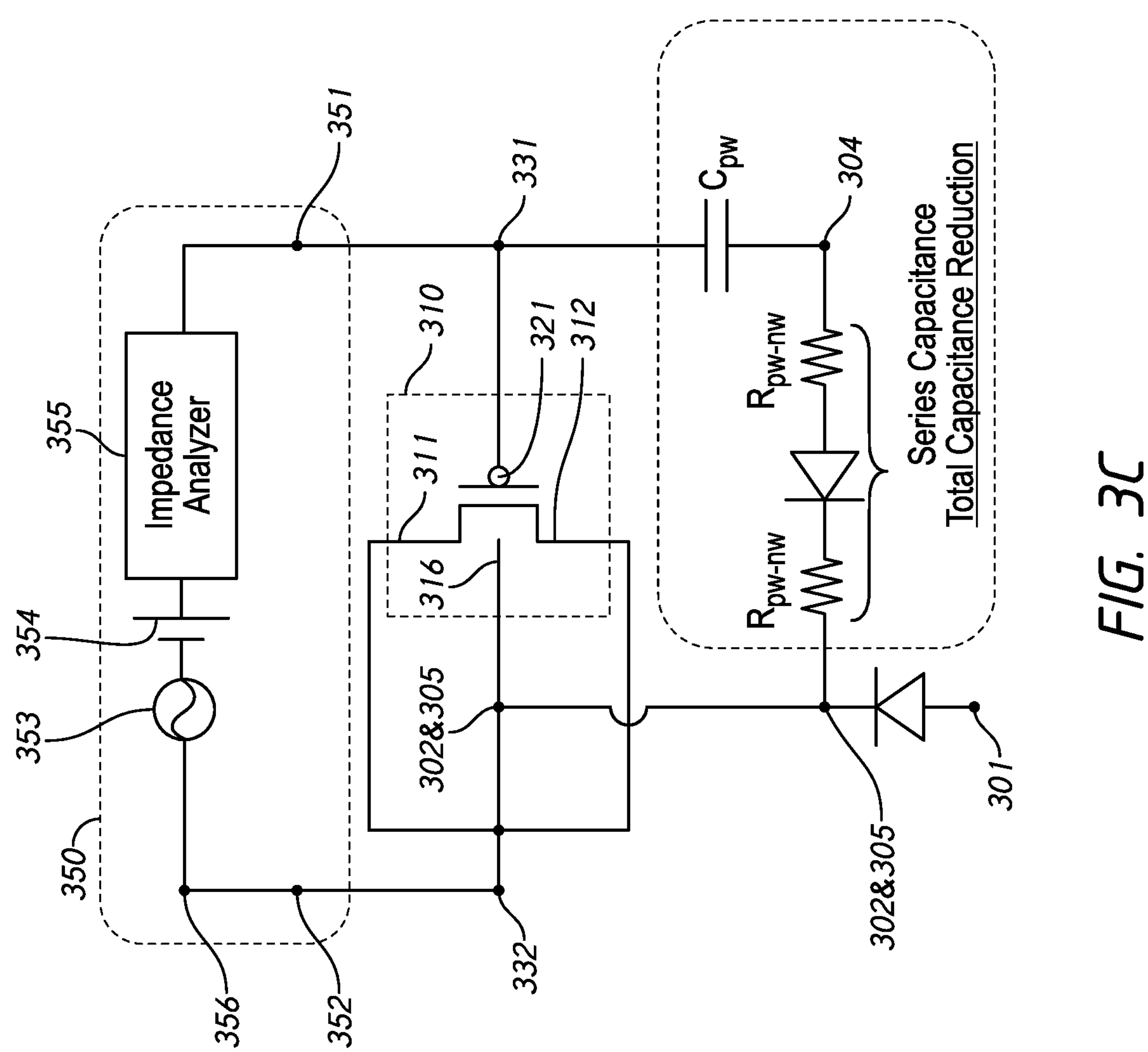
FIG. 3C depicts an equivalent circuit of a TEG and a test apparatus according to an embodiment of the disclosure.

FIGS. 2A and 2B depict an example of a schematic configuration of at least part of a TEG 200 including an n-channel MOSFET (NMOSFET) 210 in a scribe region on a semiconductor wafer in a plan view and a cross-sectional view (along section line A-A of the plan view), respectively, according to an embodiment of the disclosure. FIG. 2C depicts an example of an equivalent circuit of the TEG 200 and a test apparatus 250 connected to the TEG 200 according to the present embodiment. FIGS. 3A and 3B depict an example of a schematic configuration of at least part of a TEG 300 including a p-channel MOSFET (PMOSFET) 310 in a scribe region on a semiconductor wafer in a plan view and a cross-sectional view (along section line A-A of the plan view), respectively, according to an embodiment of the disclosure. FIG. 3C depicts an example of an equivalent circuit of the TEG 300 and a test apparatus 350 connected to the TEG 200 according to the present embodiment. The scribe region and the semiconductor wafer may be the scribe region 108 and the semiconductor wafer 100 of FIG. 1, respectively. The scribe region may include either one or both of the TEG 200 and the TEG 300. Some elements shown in FIG. 2A/3A in the plan view and corresponding elements with the same reference signs shown in FIG. 2B/3B in the cross-sectional view may not match in shape, size, position, and the like for the sake of simplicity of illustration of the schematic configuration according to the present embodiment.

The TEG 200 in FIGS. 2A-2B is provided on a semiconductor substrate 201. The semiconductor substrate 201 may be a p-type semiconductor substrate. The semiconductor substrate 201 may include an outside p-well in a floating state. The semiconductor substrate 201 includes an n-well 202 and a p-well 203 surrounded by the n-well 202. The n-well 202 and the p-well 203 are coupled to ground. The TEG 200 includes the NMOSFET 210 above the p-well 203. The drawing shows at least an active area of NMOSFET 210. The active area includes at least a plurality of sources 211 and a plurality of drains 212 forming a plurality of source-drain pairs. The source-drain pairs are, in a plan view, arranged side-by-side in a horizontal direction, which is Y-direction in the drawing, with a plurality of gates 221 arranged above the respective source-drain pairs. The gates 221 are coupled to the sources 211 and the drains 212 in the active area of the NMOSFET 210 via one or more gate contacts 220. The gate contacts 220 are provided between an upper surface (or a top surface) of the source and drain 211 and 212 and a lower surface (or a bottom surface) of the gate 221. The gate 221 and the gate contacts 220 form at least part of a gate structure. The gate 221 is coupled to a gate pad 231 and a source-drain pad 232 via one or more contacts 230 and wirings 241. The contacts 230 are provided between an upper surface (or a top surface) of the gate 221 and lower surfaces (or bottom surfaces) of the wirings 241. The wirings 241 provide wire routing between the gate, source and drain 221, 211 and 212 and the corresponding gate and source-drain pads 231 and 232. The wirings 241 are provided in the same layer as the gate and source-drain pads 231 and 232. The wirings 241 and the gate and source-drain pads 231 and 232 form at least part of a wiring structure. The gate pad 231 and the source-drain pad 232 are provided in one metal layer formed above the semiconductor substrate. The metal layer may be the lowermost metal layer MO. The metal layer is surrounded by one or more insulating layers (not separately depicted). The gate pad 231 and the source-drain pad 232 each have a rectangular shape in a plan view. The gate pad 231 and its wiring 241 and the source-drain pad 232 and its wiring 241 are arranged next to each other in another horizontal direction, which is X-direction in the drawing, in the same wiring layer. The wirings 241 in FIG. 2A are shown as multiple straight lines with dots at both ends of each line for the sake of simplicity of illustration but are formed as part of the wiring layer as shown in FIG. 2B in the present embodiment. The shape, size, position, number, and the like of the wirings 241 may not be limited to those illustrated in FIGS. 2A and 2B and may be modified as appropriate. The gate pad 231 and the source-drain pad 232 may include metal material, such as tungsten (W). The gate pad 231 and the source-drain pad 232 may be configured to be electrically probed during testing of electric properties/characteristics. The source-drain pad 232 may also be a bulk pad. In the drawing. X- and Y-directions are perpendicular to each other in a horizontal plane. In the drawing, X- and Y-directions are perpendicular to a vertical direction, Z-direction, in a vertical plane.

The TEG 200 further includes an n+ plug 213 and a p+ plug 214 above the n-well 202 and the p-well 203, respectively. The n+ plug 213 and the p+ plug 214 are provided in the same layer as the gate structure above the semiconductor substrate 201. The n+ plug 213 and the p+ plug 214 are coupled to the source-drain pad 232 via contact plugs 240 and the wirings 241. The contact plugs 240 are provided between upper surfaces (or top surfaces) of the n+ and p+ plugs 213 and 214 and lower surfaces (or bottom surfaces) of the wirings 241.

An isolation layer 215 is also provided above the semiconductor substrate 201 to provide electric isolation. The isolation layer 215 may include a shallow trench isolation (STI). The isolation layer 215 is not depicted in the plan view for the sake of simplicity.

Further provided in the TEG 200 is a floating p-well 204 in the semiconductor substrate 201. The floating p-well 204 is positioned under the gate pad 231. The floating p-well 204 has a greater size than the gate pad 231 to surround the entirety of the gate pad 231 in the plan view. The floating p-well 204 is in a floating state with no connection to power supply. Although pad-well parasitic capacitance $C_{pw}$ between the gate pad 231 and the floating p-well 204 (see $C_{pw}$ in FIGS. 2B and 2C) may be relatively large due to the shorter distance between the well structure formed in the semiconductor substrate 301 and the gate pad 231 provided in the metal layer relatively close to the semiconductor substrate 301, the pad-well parasitic capacitance $C_{pw}$ is effectively reduced due to the floating p-well 204.

Furthermore, the floating p-well 204 is surrounded by the n-well 202 in the semiconductor substrate 201. The n-well 202 provides shielding of the floating p-well 204 from a noise, such as a noise from outside. Because of this configuration, the floating p-well 204 and in turn the TEG 200 are robust against noise and receive less adverse effects of noise during testing.

A deep n-well 205 is further provided in the semiconductor substrate 201. The floating p-well 204 is surrounded by both the n-well 202 and the deep n-well 204. Because of this configuration, the floating p-well 204 and thereby the TEG 200 are further effectively shielded from noise.

Accordingly, the TEG 200 of the present embodiment effectively reduces the pad-well parasitic capacitance while maintaining the noise shielding or protection during testing of electric properties, such as the gate vertical resistance $R_{gv}$.

During testing using the TEG 200, for example, as shown in FIG. 2C, a gate probe 251 and a source-drain probe 252 of the test apparatus 250 are connected to the gate pad 231 and the source-drain pad 232, which are coupled to the gate (or a gate terminal) 221 and the source and drain (or source and drain terminals) 211 and 212 as well as a bulk (or a bulk terminal) 216 of the NMOSFET 210. The bulk 216 is not separately depicted in FIGS. 2A-2B for the sake of simplicity, but it is coupled to the p-well 203. In the example, the source-drain pad 232 is also a bulk pad and may also be referred to as a bulk and source-gate pad, and the source-drain probe 252 may also be referred to as a bulk and source-gate probe. The test apparatus 250 includes an AC source 253, a DC source 254, and an impedance analyzer 255 in series with one another. The test apparatus 250 is configured to perform testing of one or more electric characteristics of a target device. The test apparatus 250 may be a test device, a test module, or the like. The AC source 253 is coupled to a ground 256, to which the bulk and source-drain probe 252 is also coupled. The impedance analyzer 255 measures impedance of the gate 221 and analyzes and evaluates, for example, the gate vertical resistance $R_{gv}$. In addition to the pad-well parasitic capacitance $C_{pw}$, there may be parasitic resistance $R_{pw-nw}$ between the floating p-well 204 and the n-well and deep n-well 202 and 205. Components of the parasitic resistance $R_{pw-nw}$ coupled in series act as series capacitance. According to the present embodiment, both the pad-well parasitic capacitance $C_{pw}$ and the parasitic resistance $R_{pw-nw}$ may be reduced together, and greater total capacitance reduction can be achieved while maintaining the effective noise shielding of the floating p-well 204 by the n-well and deep-well 202 and 205.

The TEG 300 in FIGS. 3A-3B has the same or substantially the same structure as the TEG 200 in FIGS. 2A-2B, except that, for example, there are no elements corresponding to the p-well 203 and the p+ plug 214 and that the MOSFET is the PMOSFET 310 instead of the NMOSFET 210. A semiconductor substrate 301, an n-well 302, a floating p-well 304, a deep n-well 305, sources 311, drains 312, an n+ plug 313, an insulating layer 315, gate contacts 320, gates 321, contacts 330, a gate pad 331, a source-drain pad 332, a contact plug 340, and wirings 341 are the same or substantially the same as the corresponding elements of the TEG 200. The TEG 300 achieves the same or substantially the same effects and advantages as the TEG 200. Detailed descriptions thereof are omitted.

In a similar manner to the example in FIG. 2C, during testing using the TEG 300, as shown in FIG. 3C, a gate probe 351 and a source-drain probe 352 of the test apparatus 350 are connected to the gate pad 331 and the source-drain pad 332, which are coupled to the gate (or a gate terminal) 321 and the source and drain (or source and drain terminals) 311 and 312 as well as a bulk (or a bulk terminal) 316 of the PMOSFET 310. The bulk 316 is not separately depicted in FIGS. 3A-3B for the sake of simplicity, but it is coupled to the n-well 302 and the deep n-well 305. In the example, the source-drain pad 332 is also a bulk pad and may also be referred to as a bulk and source-gate pad, and the source-drain probe 352 may also be referred to as a bulk and source-gate probe. The test apparatus 350 includes an AC source 353, a DC source 354, and an impedance analyzer 355 in series with one another. The AC source 353 is coupled to a ground 356, to which the bulk and source-drain probe 352 is also coupled. The impedance analyzer 355 measures impedance of the gate 321 and analyzes and evaluates, for example, the gate vertical resistance $R_{gv}$. In addition to the pad-well parasitic capacitance $C_{pw}$, there may be parasitic resistance $R_{pw-nw}$ between the floating p-well 304 and the n-well and deep n-well 302 and 305. Components of the parasitic resistance $R_{pw-nw}$ coupled in series act as series capacitance. According to the present embodiment, both the pad-well parasitic capacitance $C_{pw}$ and the parasitic resistance $R_{pw-nw}$ may be reduced together, and greater total capacitance reduction can be achieved while maintaining the effective noise shielding of the floating p-well 304 by the n-well and deep-well 302 and 305.

As for the TEG 200 and the TEG 300, in one embodiment, the n-well 202/302 may have a greater size than the gate pad 231/331 in a plan view to surround the entirety of the gate pad 231/331.

As for the TEG 200, in one embodiment, the p-well 203 coupled to ground may be surrounded by the n+ plug 213 and/or the p+ plug 214 in a plan view to reduce resistance. Furthermore, in one embodiment, the n+ plug 213 and/or the p+ plug 214 can have further less resistance by providing wirings and contacts, such as the wirings 241 and the contact plugs 240, in a denser arrangement.

As for the TEG 300, in one embodiment, the n+ plug 313 can have less resistance by providing wirings and contacts, such as the wirings 341 and the contact plugs 340, in a denser arrangement.

As for the TEG 200 and the TEG 300, in one embodiment, the gate pad 231/331 and the source-drain pad 232/332 may be arranged further apart from each other in the horizontal (X) direction.

As for the TEG 200 and the TEG 300, in one embodiment, the deep n-well 205/305 may be provided directly under the n-well 202/302.

As for the TEG 200 and the TEG 300, in one embodiment, a further p+ plug (not separately depicted) may be provided between the gate pad 231/331 and the floating p-well 204/305. The further p+ plug may be provided directly under the gate pad 231/331.

As for the TEG 200 and the TEG 300, in one embodiment, the pad-well parasitic capacitance $C_{pw}$ is generated regardless of electric potential amount and direction, and a relatively small DC voltage (for example, about 1.0 V) may be applied to the gate 221/321.

Figures 4A, 4B:
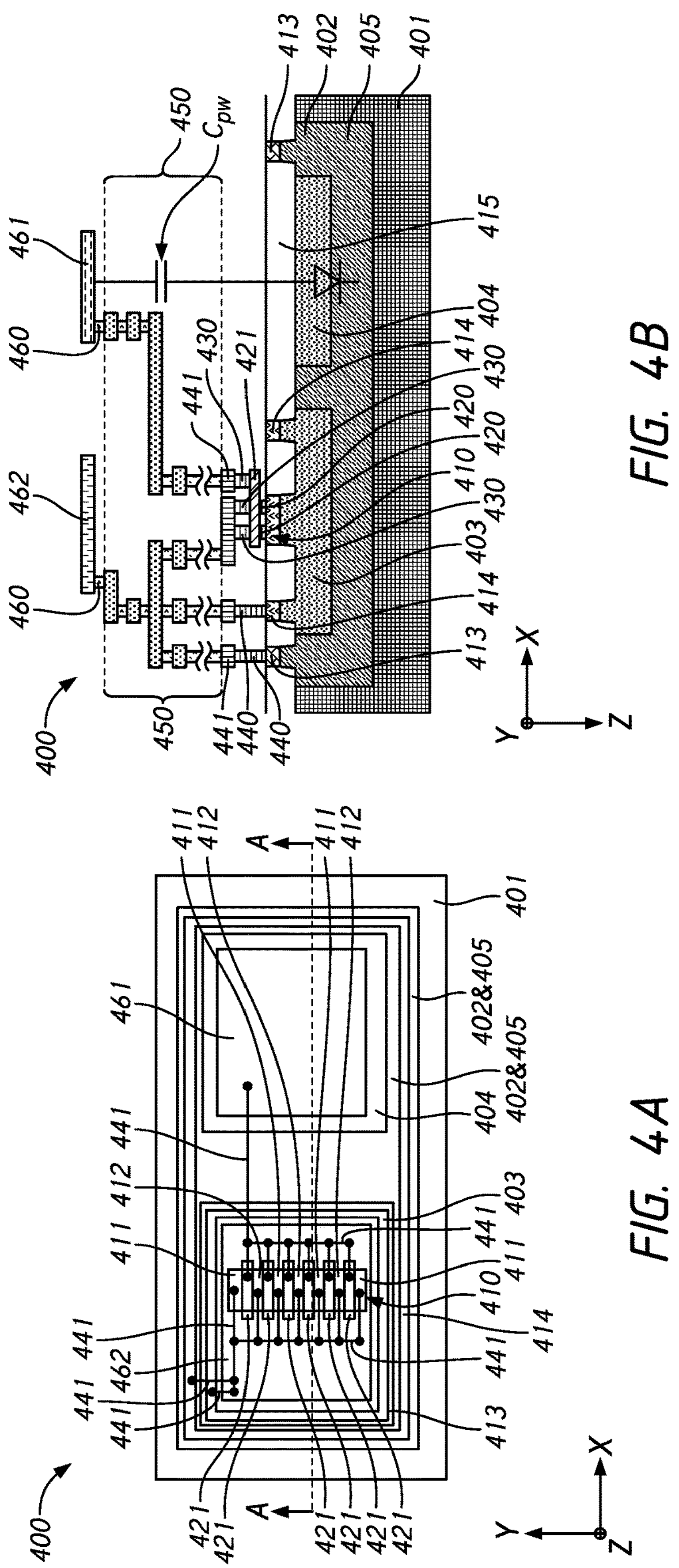
FIGS. 4A and 4B depict a schematic configuration of at least part of a TEG including an n-channel MOSFET in a scribe region on a semiconductor wafer in a plan view and a cross-sectional view, respectively, according to an embodiment of the disclosure.
Figures 5A, 5B:
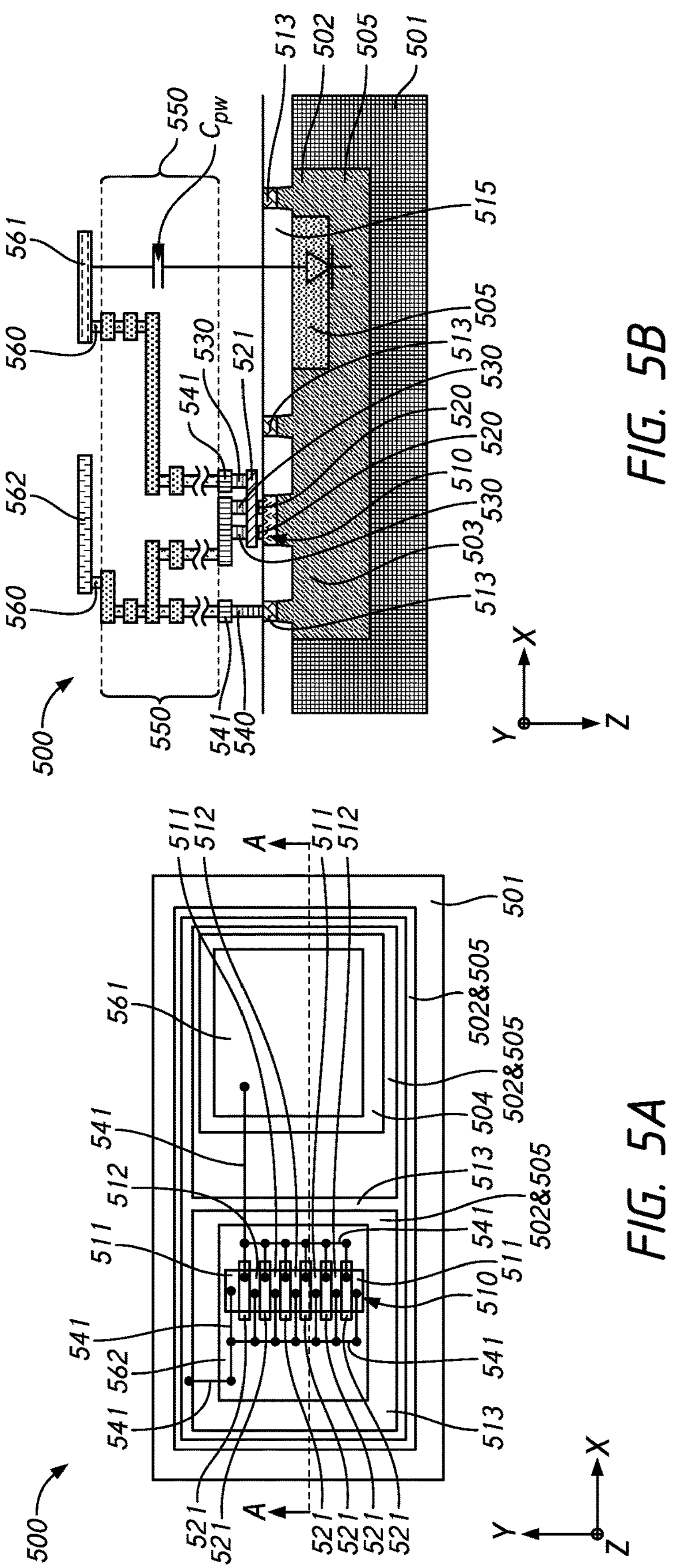
FIGS. 5A and 5B depict a schematic configuration of at least part of a TEG including a p-channel MOSFET in a scribe region on a semiconductor wafer in a plan view and a cross-sectional view, respectively, according to an embodiment of the disclosure.

FIGS. 4A and 4B depict an example of a schematic configuration of at least part of a TEG 400 including an n-channel MOSFET (NMOSFET) 410 in a scribe region on a semiconductor wafer in a plan view and a cross-sectional view (along section line A-A of the plan view), respectively, according to an embodiment of the disclosure. FIGS. 5A and 5B depict an example of a schematic configuration of at least part of a TEG 500 including a p-channel MOSFET (PMOSFET) 510 in a scribe region on a semiconductor wafer in a plan view and a cross-sectional view (along section line A-A of the plan view), respectively, according to an embodiment of the disclosure. Some elements shown in FIG. 4A/5A in the plan view and corresponding elements with the same reference signs shown in FIG. 4B/5B in the cross-sectional view may not match in shape, size, position, and the like for the sake of simplicity of illustration of the schematic configuration according to the present embodiment.

The TEG 400/500 includes, on a semiconductor substrate 401/501, sources 411/511, drains 412/512, an n+ plug 413/513, a p+ plug 414, an insulating layer 415/515, gate contacts 420/520, gates 421/521, contacts 430/530, contact plugs 440/540, wirings 441/541, a metal layer stack 450/550, vias 460/560, a gate pad 461/561, and a source-drain pad 462/562.

The TEG 400/500 have the same or substantially the same structure as the TEG 200/300, except that, for example, the gate pad 461/561 and the source-drain pad 462/562 are provided in an upper metal layer (or in a top metal layer of a metal layer stack in the example) while the wirings 441/541, which correspond to the wirings 241/341, remain in the lower metal layer above the semiconductor substrate 401/501. In the present embodiment, the wirings 441/541 may be parts of the wiring layer or the wiring structure remained after the gate pad 231/331 and the source-drain pad 232/332 in FIGS. 2 and 3 are removed during the device formation. Such pad removal may be performed before formation of the next metal layers, such as the metal layer stack 450/550. Because of the multiple metal layers forming the metal layer stack, the number, the position, the arrangement and such of various elements of the TEG 400/500 on and above the semiconductor substrate 401/501 may be different from the corresponding elements of the TEG 200/300 as appropriate.

In the example, the metal layer stack 450/550 is provided above the metal layer of the wirings 441/541. The metal layer stack 450/550 includes a plurality of horizontal metal layers and a plurality of vertical vias. The metal layers include metal wirings and/or lines. The vias are configured to electrically connect or couple the wirings and/or lines with one another in the respective metal layers. The wirings and/or lines may include metal material, such as copper (Cu). The metal layer of the wirings 441/541 may be part of the metal layer stack 450/550.

On the metal layer stack 450/550, the gate pad 461/561 and the source-drain pad 462/562 are provided in the top metal layer. The gate pad 461/561 and the source-drain pad 462/562 may include metal material, such as aluminum (Al), different from that of the wirings and/or lines in the respective metal layers. The top metal layer including the gate and source-drain pads 461/561 and 462/562 is coupled to the upper metal layer of the metal layer stack 450/550 by vertical vias 460/560. The top metal layer may also be part of the metal layer stack 450/550. The vias including the vias 460/560 may include conductive material, such as copper (Cu).

In the TEG 400/500, in the case where the wirings 441/541 are the remaining parts of the wiring layer or the wiring structure after the removal of the gate pad 231/331 and the source-drain pad 232/332 in FIGS. 2 and 3, while the gate pad 231/331 and the source-drain pad 232/332 may be used for first testing at a first stage, such as an early stage or a middle stage, of forming the semiconductor device on the semiconductor substrate or wafer, the gate pad 461/561 and the source-drain pad 462/562 may be used for second testing at a second stage, such as a final stage or a later stage nearer to the final stage, of the device formation. In such a case, the gate pad 231/331 and the source-drain pad 232/332 may be referred to as first testing pads, and the gate pad 461/561 and the source-drain pad 462/562 may be referred to as second testing pads. This multiple testing at the multiple device formation stages achieves further accurate evaluation of the gate vertical resistance $R_{gv}$ and also contributes to reduction of the device formation time. And, all the same or substantially the same effects and advantages of the TEG 200/300 can also be achieved by the TEG 400/500. Such effects and advantages include, for example, the reduction of the pad-well parasitic capacitance $C_{pw}$ due to the floating p-well 404/504 under the gate pad 461/561 and surrounding the entirety of the gate pad 461/561 in the plan view, and the noise shielding by the n-well 402/502 and the deep n-well 405/505 surrounding the floating p-well 404/504.

As for the TEG 400 and the TEG 500, in one embodiment, the n-well 402/502 may have a greater size than the gate pad 461/561 in a plan view to surround the entirety of the gate pad 461/561.

As for the TEG 400, in one embodiment, the p-well 403 coupled to ground may be surrounded by the n+ plug 413 and/or the p+ plug 414 in a plan view to reduce resistance. Furthermore, in one embodiment, the n+ plug 413 and/or the p+ plug 414 can have further less resistance by providing wirings and contacts, such as the wirings 441 and the contact plugs 440, in a denser arrangement.

As for the TEG 500, in one embodiment, the n+ plug 513 can have less resistance by providing wirings and contacts, such as the wirings 541 and the contact plugs 540, in a denser arrangement.

As for the TEG 400 and the TEG 500, in one embodiment, the gate pad 461/561 and the source-drain pad 462/562 may be arranged further apart from each other in the horizontal (X) direction.

As for the TEG 400 and the TEG 500, in one embodiment, the deep n-well 405/605 may be provided directly under the n-well 402/502.

As for the TEG 400 and the TEG 500, in one embodiment, the pad-well parasitic capacitance $C_{pw}$ is generated regardless of electric potential amount and direction, and a relatively small DC voltage (for example, about 1.0 V) may be applied to the gate 421/521.

As for the TEG 400 and the TEG 500, in one embodiment, a further p+ plug (not separately depicted) may be provided between the gate pad 461/561 and the floating p-well 404/505. The further p+ plug may be provided directly under the gate pad 461/561.

Figure 6:
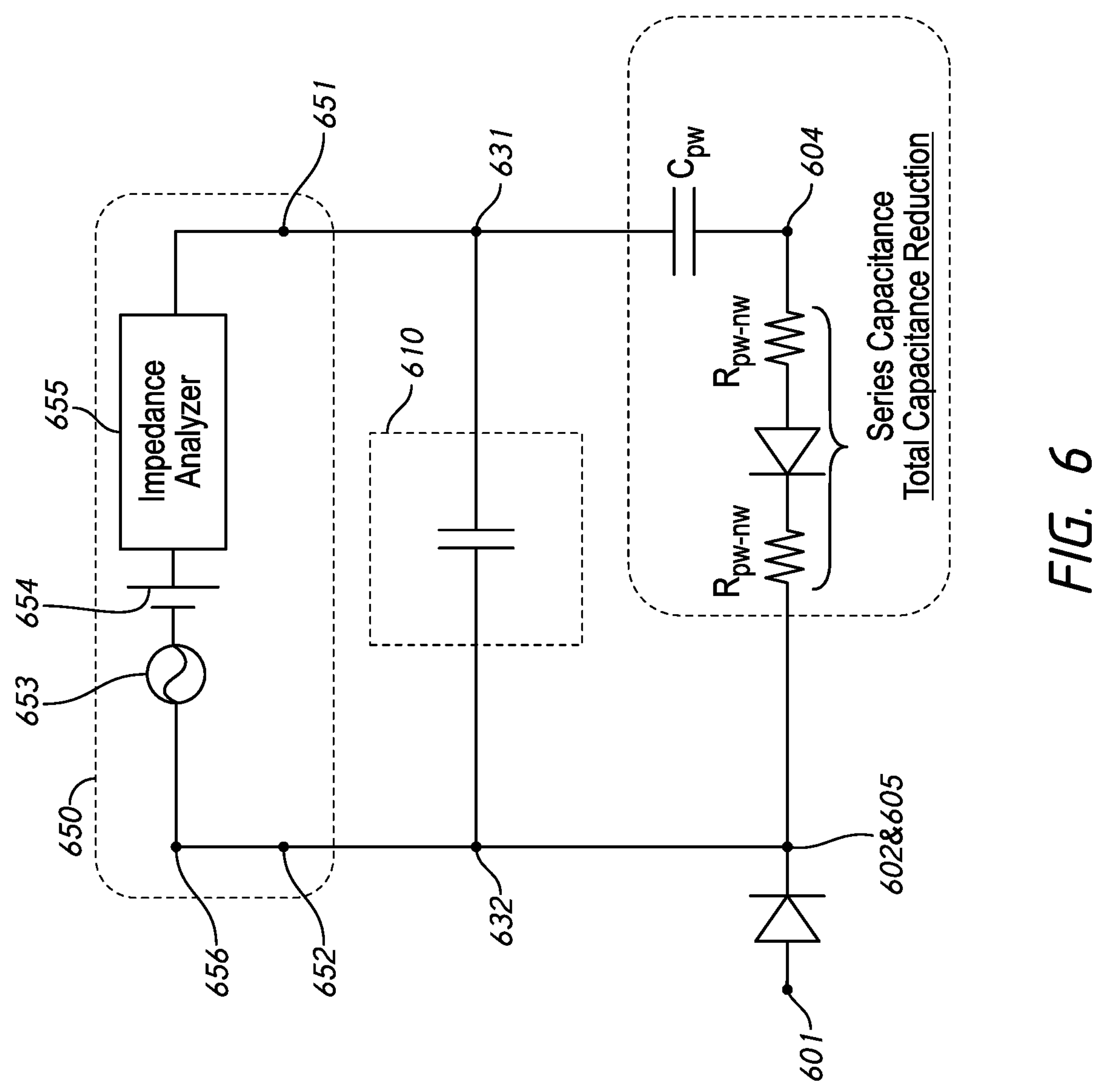
FIG. 6 depicts an equivalent circuit of a TEG and a test apparatus according to an embodiment of the disclosure.

According to some modified embodiments, the TEGs 200, 300, 400, and 500 may be modified and configured to, for example, measure and analyze capacitance characteristics of a MOSFET, or measure and analyze parasitic resistance and capacitance characteristics of a capacitive element other than a MOSFET. In the latter case, as shown in FIG. 6 that depicts an example of an equivalent circuit configuration, a capacitive element 610 replaces the MOSFET in the TEGs 200, 300, 400, and 500. A semiconductor substrate 601 (including an outside p-well in a floating state), a floating p-well 604, an n-well 602 and a deep n-well 605, a gate pad 631, a source-drain pad (or a bulk and source-drain pad) 632, a test apparatus 650, a gate probe 651, a source-drain probe (or a bulk and source-drain probe) 652, an AC source 653, a DC source 654, an impedance analyzer 655, and ground 656 are the same or substantially the same as the corresponding elements in the TEGs 200, 300, 400, and 500 and the test apparatuses 250 and 350. In the modified embodiments, parasitic capacitance of a pad (or a signal line thereof, for example) electrically probed during testing can be reduced while the pad (or the signal line) is protected from noise, and electric characteristic measurement and analysis can be conducted with greater accuracy. In a case where the capacitive element 610 does not include a gate, a source, and a drain, the gate pad 631 and the source-drain pad 632 may be simply pads or testing pads and the corresponding gate probe 651 and source-drain probes 652 may be simply probes or testing probes. The pads may be connected or coupled to, for example, one or more electrodes of the capacitive element 610 for the testing.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:
- a pad above a semiconductor substrate;
- an n-well in the semiconductor substrate; and
- a floating p-well in the semiconductor substrate, the floating p-well below the pad and surrounded by the n-well in the semiconductor substrate.

2. The apparatus according to claim 1, further comprising a deep n-well in the semiconductor substrate, wherein the floating p-well is surrounded by the n-well and the deep n-well.

3. The apparatus according to claim 2, wherein the deep n-well is under the n-well.

4. The apparatus according to claim 1, wherein the pad is configured to be electrically probed during testing.

5. The apparatus according to claim 1, wherein the pad is coupled to a capacitance element.

6. The apparatus according to claim 1, wherein the pad is coupled to a gate of a transistor.

7. The apparatus according to claim 1, wherein the pad is coupled to a gate of a MOSFET.

8. The apparatus according to claim 1, wherein the n-well is greater in size than the pad in a plan view.

9. The apparatus according to claim 1, further comprising:
- a p-well in the semiconductor substrate; and
- at least one of an n+ plug and a p+ plug above the semiconductor substrate, wherein
- the p-well is surrounded by the at least one of the n+ plug and the p+ plug.

10. The apparatus according to claim 1, wherein
- the pad is a first pad, and
- the apparatus further comprises a second pad above the semiconductor substrate, the second pad arranged apart from the first pad in a horizontal direction.

11. An apparatus, comprising:
- a pad above a semiconductor substrate, the pad configured to be electrically probed during testing;
- an n-well in the semiconductor substrate;
- a deep n-well in the semiconductor substrate, the deep n-well under the n-well; and
- a floating p-well in the semiconductor substrate, the floating p-well below the pad and surrounded by the n-well and the deep n-well in the semiconductor substrate.

12. The apparatus according to claim 11, wherein the pad is configured to be coupled to a testing probe of a test apparatus.

13. The apparatus according to claim 11, wherein the pad is coupled to a capacitance element.

14. The apparatus according to claim 11, wherein the pad is coupled to a gate of a transistor.

15. The apparatus according to claim 11, wherein the n-well is greater in size than the pad in a plan view to surround entirety of the pad.

16. The apparatus according to claim 11, wherein
- the pad is a first pad, and
- the apparatus further comprises a second pad above the semiconductor substrate, the second pad in the same layer as the first pad and arranged apart from the first pad in a horizontal direction.

17. A test element group in a scribe region on a semiconductor substrate, comprising:
- a pad above the semiconductor substrate in the scribe region, the pad coupled to a capacitance element;

an n-well in the semiconductor substrate in the scribe region; and a floating p-well in the semiconductor substrate in the scribe region, the floating p-well below the pad and surrounded by the n-well in the semiconductor substrate.

18. The test element group according to claim 17, further comprising a deep n-well in the semiconductor substrate in the scribe region, wherein the floating p-well is surrounded by the n-well and the deep n-well.

19. The test element group according to claim 17, wherein the capacitance element is at least part of a transistor.

20. The test element group according to claim 17, wherein the test element group is at least part of a memory device.

* * * * *